United States Patent
Arnaud

(10) Patent No.: US 8,329,525 B2
(45) Date of Patent: Dec. 11, 2012

(54) METHOD FOR FABRICATING AT LEAST THREE METAL-OXIDE SEMICONDUCTOR TRANSISTORS HAVING DIFFERENT THRESHOLD VOLTAGES

(75) Inventor: Franck Arnaud, Nazaire les Eymes (FR)

(73) Assignee: STMicroelectronics, Inc., Coppell, TX (US)

( * ) Notice: Subject to any disclaimer, the term of this patent is extended or adjusted under 35 U.S.C. 154(b) by 87 days.

(21) Appl. No.: 12/897,258

(22) Filed: Oct. 4, 2010

(65) Prior Publication Data

US 2012/0080758 A1  Apr. 5, 2012

(51) Int. Cl.
*H01L 21/336* (2006.01)

(52) U.S. Cl. ........ 438/197; 438/287; 438/981; 257/369; 257/392; 257/E51.006

(58) Field of Classification Search .................. 257/213, 257/288, 368, 391, 392, E51.006, 369; 438/142, 438/197, 275, 287, 591, 981
See application file for complete search history.

(56) References Cited

U.S. PATENT DOCUMENTS

| | | | |
|---|---|---|---|
| 6,821,833 B1 | 11/2004 | Chou et al. | |
| 2002/0039816 A1 | 4/2002 | Watanabe | |
| 2002/0185693 A1* | 12/2002 | Yasuda et al. | 257/392 |
| 2003/0082863 A1 | 5/2003 | Lim et al. | |
| 2004/0043567 A1 | 3/2004 | Krishnan et al. | |
| 2005/0186765 A1* | 8/2005 | Ma et al. | 438/532 |
| 2007/0045719 A1* | 3/2007 | Wang et al. | 257/324 |
| 2008/0230814 A1* | 9/2008 | Lee et al. | 257/288 |
| 2010/0155854 A1 | 6/2010 | Stahrenberg et al. | |

* cited by examiner

*Primary Examiner* — Khiem D Nguyen
(74) *Attorney, Agent, or Firm* — Gardere Wynne Sewell LLP

(57) ABSTRACT

At least three metal-oxide semiconductor transistors with different threshold voltages are formed in and above corresponding first, second and third parts of a semiconductor substrate. The second transistor has a lower threshold voltage than the second transistor, and the third transistor has a lower threshold voltage than the second transistor. The gate oxide layers for the three transistors are formed as follows: a first oxide layer having a first thickness is formed above the first, second and third parts. The first oxide layer above the second part is etched and a second oxide layer having a second thickness smaller than the first thickness is formed. The first oxide layer above the third part is etched and a third oxide layer having a third thickness smaller than the second thickness is formed. The second and the third oxide layers are then nitrided to form first and second oxy-nitride layers.

15 Claims, 2 Drawing Sheets

METHOD FOR FABRICATING AT LEAST THREE METAL-OXIDE SEMICONDUCTOR TRANSISTORS HAVING DIFFERENT THRESHOLD VOLTAGES

TECHNICAL FIELD

The present disclosure relates to fabrication of semiconductor devices for integrated circuits.

BACKGROUND

The electronic properties of a transistor made in an integrated circuit depend on the shape of the transistor and on the materials used to make the transistor. The speed and the threshold voltage of a transistor may vary with the thickness of the gate insulator and/or with the dielectric constant of the material forming the gate insulator. However, depending on the function of the transistor in the integrated circuit, it may be necessary to obtain specific electronic properties, and thus a specific shape or composition of the transistor. For instance, low leakage transistors are known to exhibit low leakage current, and are used for usual analog and logic functions; interface transistors are known to carry high voltages (about 2 volt) and are used for analog functions; and high speed transistors are known to exhibit short response time and are used, for instance, for radio-frequency analog circuits or for high speed analog circuits. The differences of electronic properties of the above-mentioned transistors may be chosen by the features (thickness and/or dielectric constant) of the gate insulator and/or by the features (length or width) of the gate.

Thus, when an integrated circuit comprises several transistors with specific features, it is necessary to provide different fabrication methods. It is then possible to make the different kinds of transistors independently. However, such a process increases the number of processing steps, and thus the cost of the process. Moreover, it is not always possible to obtain the gate insulators with the structural differences (length or width of the gate, thickness or dielectric constant of the gate insulator) allowing to exhibit the desired properties.

SUMMARY

The present disclosure generally provides a method for producing several different transistors, which may reduce the amount of steps of fabrication.

The present disclosure also provides a method, which allows for the simple production of at least three transistors having different threshold voltages.

In one embodiment, the present disclosure provides a method for fabricating at least three metal-oxide semiconductor (MOS) transistors in and above a semiconductor substrate. An at least first transistor is formed in and above a first part of the substrate and has a first threshold voltage, an at least second transistor is formed in and above a second part of the substrate and has a second threshold voltage lower than the first threshold voltage, and an at least third transistor is formed in and above a third part of the substrate and has a third threshold voltage lower than the second threshold voltage.

The method comprises: forming, above the three parts of the substrate, a first oxide layer having a first thickness, etching, above the second part of the substrate, the first oxide layer, forming, above the second part of the substrate, a second oxide layer having a second thickness inferior to the first thickness, etching, above the third part of the substrate, the first oxide layer, forming, above the third part of the substrate, a third oxide layer having a third thickness inferior to the second thickness, and nitriding the second and the third oxide layers so as to form a first and a second oxy-nitride layers.

The method may also comprise: forming a high-k dielectric layer, for instance an hafnium oxide layer, on the first and second oxy-nitride layers and on the first oxide layer formed above the first part of the substrate, and forming a gate material layer above the high-k dielectric layer.

The step of forming a first oxide layer having a first thickness may comprise depositing, for instance by chemical vapor deposition, a high temperature oxide, for instance silicon dioxide.

The step of forming a second oxide layer may comprise a rapid thermal oxidation of the surface of the second part of the substrate.

The step of forming a third oxide layer may comprise a rapid thermal oxidation of the surface of the third part of the substrate, with a duration shorter than the duration of the rapid thermal oxidation of the second part of the substrate.

The step of nitriding the second and the third oxide layers may comprise a decoupled plasma nitridation (DPN).

The step of nitriding the second and the third oxide layers may further comprises a post-nitridation annealing (PNA).

The first and the second oxy-nitride layers may comprise silicon oxy-nitride.

The method may further comprise forming source and drain regions of the at least three transistors.

Other technical features may be readily apparent to one skilled in the art from the following figures, descriptions and claims.

BRIEF DESCRIPTION OF THE DRAWINGS

For a more complete understanding of this disclosure and its features, reference is now made to the following description, taken in conjunction with the accompanying drawings, in which.

DETAILED DESCRIPTION OF THE DRAWINGS

Figure 1:
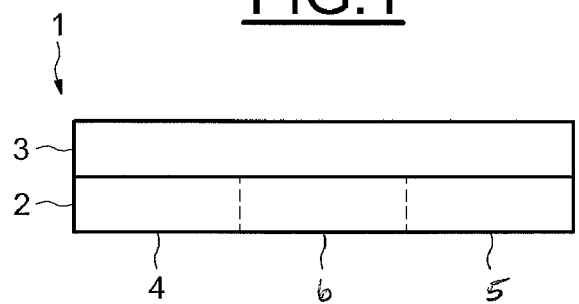
FIG. 1 is a somewhat simplified diagram illustrating a section of an integrated circuit with a high temperature oxide layer, according to one embodiment of the present disclosure.

FIG. 1 very schematically represents a section of an integrated circuit 1 comprising a substrate 2, made of, for example, silicon, and a high temperature oxide layer 3. The high temperature oxide layer 3 may comprise silicon dioxide $SiO_2$, and may be produced by low pressure chemical vapor deposition (LPCVD), on the upper surface of the substrate 2.

Furthermore, the substrate 2 also comprises three different areas 4, 5 and 6 in and above which will be respectively produced a first, a second and a third transistor having different threshold voltage.

The high temperature oxide layer 3 is a part, as it will be seen later, of the gate insulator of the transistor having the highest threshold voltage, i.e. the part of the high temperature oxide layer 3 located above the first area 4 of the substrate 2, is a part of the gate insulator of the transistor having the highest threshold voltage. The high temperature oxide layer 3 may have a thickness comprised between 3 and 6 nm, preferably of about 4.5 nm. The high temperature oxide layer 3 allows the transistor to carry relatively high voltages, of about 2 volt.

Figure 2:
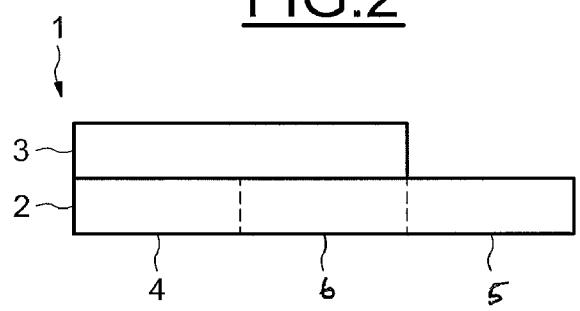
FIG. 2 is a somewhat simplified diagram illustrating a section of the integrated circuit after the etching of a first part of the high temperature oxide layer.

The high temperature oxide layer 3 is then etched, as shown in FIG. 2, above the second area 5 of the substrate 2, where the transistor having the intermediate threshold voltage will be produced. Thanks to the partial etching of the high temperature oxide layer 3, the upper surface of the second area 5 of the substrate 2 is free.

Figure 3:
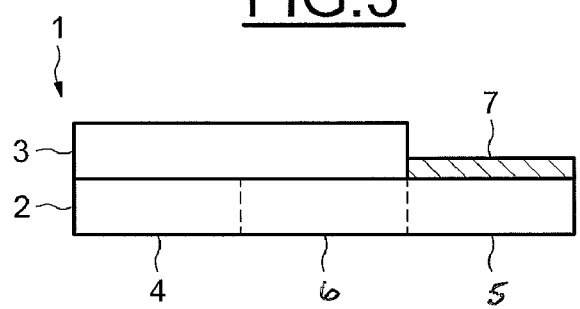
FIG. 3 is a somewhat simplified diagram illustrating a section of the integrated circuit after the formation of a first rapid thermal oxide layer.

Then, a step of rapid thermal oxidation is performed so as to produce a first silicon dioxide layer 7 on the upper surface of the second area 5 of the substrate 2 (FIG. 3). The thickness of the first silicon dioxide layer 7 depends on the duration of the rapid thermal oxidation. In particular, the first silicon dioxide layer 7 may have a thickness comprised between 1 and 2 nm, preferably of about 1.5 nm.

Figure 4:
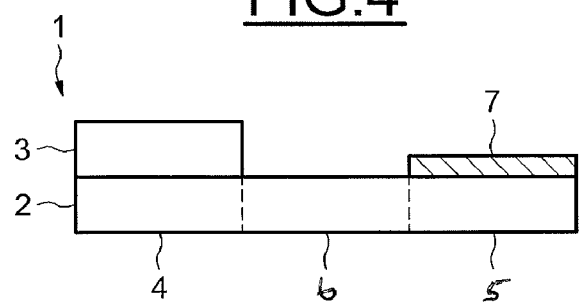
FIG. 4 is a somewhat simplified diagram illustrating a section of the integrated circuit after the etching of a second part of the high temperature oxide layer.

The high temperature oxide layer 3 is then etched, as shown in FIG. 4, above the third area 6 of the substrate 2, where the transistor having the smallest (lowest) threshold voltage will be produced. Thanks to the partial etching of the high temperature oxide layer 3, the upper surface of the third area 6 of the substrate 2 is free.

Figure 5:
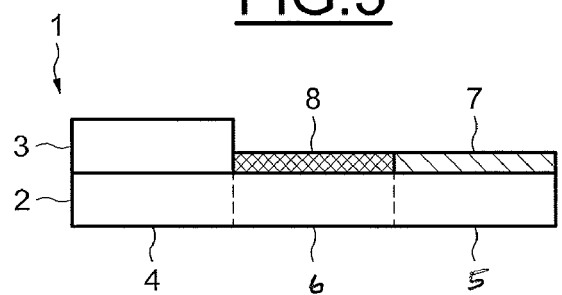
FIG. 5 is a somewhat simplified diagram illustrating a section of the integrated circuit after the formation of a second rapid thermal oxide layer.

Then, a step of rapid thermal oxidation is performed so as to produce a second silicon dioxide layer 8 on the upper surface of the third area 6 of the substrate 2 (FIG. 5). The thickness of the second silicon dioxide layer 8 depends on the duration of the rapid thermal oxidation. In particular, the duration of the second step of rapid thermal oxidation is chosen shorter than the duration of the step of the first rapid thermal oxidation, so as to obtain a second silicon dioxide layer 8 having a thickness smaller than the thickness of the first silicon dioxide layer 7. Moreover, during the second rapid thermal oxidation, the second area 5 of the substrate 2 is also oxidized, so that the thickness of the first silicon dioxide layer 7 still remains larger than the thickness of the second silicon dioxide layer 8. Thus, the second silicon dioxide layer 8 may have a thickness comprised between 0.5 and 1.5 nm, preferably of about 1 nm. Therefore, the third transistor will exhibit a smaller threshold voltage than the second transistor.

Figure 6:
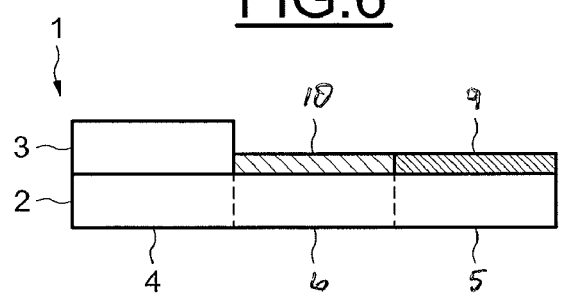
FIG. 6 is a somewhat simplified diagram illustrating a section of the integrated circuit after the nitriding step of the rapid thermal oxidation layers.

Then, a nitriding step is performed, for instance a decoupled plasma nitriding step, so as to obtain a first oxy-nitride layer (SiON) 9 and a second oxy-nitride layer 10 (FIG. 6). As the second silicon dioxide layer 8 has a smaller thickness than the first silicon dioxide layer 7, the second oxy-nitride layer 10 has also a thickness smaller than the thickness of the first oxy-nitride layer 9. Moreover, a post-nitriding annealing may be performed after the nitriding step, so as to fix the nitrogen in the layers 9 and 10, and so as to suppress the possible defects generated during the nitriding step.

Figure 7:
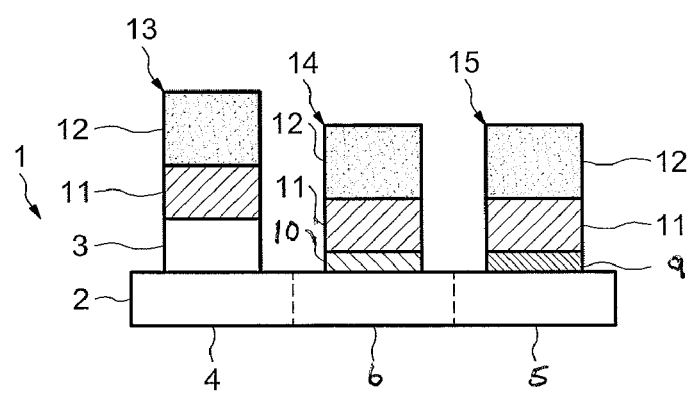
FIG. 7 is a somewhat simplified diagram illustrating a section of the integrated circuit after the formation of the gate, the drain region and the source region.

Finally, a high-k dielectric layer 11 is produced on the layers 3, 9 and 10 (FIG. 7). The high-k dielectric material may comprise hafnium dioxide. The high-k dielectric layer 11 allows both to increase the overall thickness of the gate isolator, leading to a reduction of the leakage currents, and not to strongly increase the capacitance equivalent thickness of the gate insulation thanks to the gap between the value of the dielectric constant of the oxi-nitride layers 9, 10 and the value of the dielectric constant of the material of layer 11. Therefore, the threshold voltage of the transistors will only be slightly amended by the layer 11. Then, a gate material layer 12 is produced on the layer 11 to completely form the gate of the transistors, and the drain region and the source region (not shown) are produced on both sides of the gates, so as to obtain three transistors 13, 14, 15. The gate material may be titanium nitride TiN, tantalum nitride TaN, tungsten nitride WN, or carbonitrides such as TiCN, TaCN, WCN, or copper. In this case, an intermediate layer of titanium nitride TiN will preferably be formed between the high-k dielectric layer 11 and the copper layer 12. The first transistor 13 has a gate insulator comprising a high temperature oxide layer 3 with a thickness larger than the thickness of transistors 14 and 15. The first transistor 13 has a greater threshold voltage, of about 2 volts, and may be used as interface transistor. The second transistor 14 has an insulator gate comprising an oxy-nitride layer 9 with a thickness smaller than the thickness of the first transistor 13. The second transistor 14 has thus a smaller threshold voltage than the first transistor 13, and a shorter response time. The third transistor 15 has a gate insulator comprising an oxy-nitride layer 10 with a thickness smaller than the thickness of the second transistor 14. The third transistor 15 thus exhibits the smallest threshold voltage, and the shortest response time, which allows the third transistor 15 to be used as an high speed transistor.

The high-k dielectric material layer 11 allows for an increase in the overall thickness of the gate isolator, leading to a reduction of the leakage currents and to an improvement of the mechanical strength. Moreover, the high-k dielectric material layer 11 allows for a reduction in the increase of the overall dielectric constant of the gate insulator, thanks to a dielectric constant superior to the one of the oxy-nitride layers 9, 10.

Therefore, the gate insulators of the three transistors are produced together, by jointly performing some of the steps of fabrication of three or two transistors at the same time. It eases the method of fabrication of the three transistors, and it reduces their cost. Moreover, the rapid thermal oxidation step allows the formation of two gate insulators having two different thicknesses, by controlling the duration of the nitriding step. Moreover, as the second rapid thermal oxidation amends both the second area 5 of the substrate 2 and the third area 6 of the substrate 2, it is possible for there to remain a thickness difference between the first and the second silicon dioxide, i.e. a thickness difference between the first oxy-nitride layer 9 and the second oxy-nitride layer 10. The process is thus simpler and more reliable.

While this disclosure has described one embodiment and associated methods, alterations of this embodiment and method will be apparent to those skilled in the art. Accordingly, the above description does not define or constrain this disclosure. Others changes, substitutions and alterations are also possible without departing from the spirit and scope of this disclosure, as defined by the following claims.

What is claimed is:
1. A method, comprising:
   forming, above a first part, a second part and a third part of a semiconductor substrate, a first oxide layer having a first thickness;
   etching, above the second part of the semiconductor substrate, the first oxide layer;
   forming, above the second part of the semiconductor substrate, a second oxide layer having a second thickness smaller than the first thickness;

etching, above the third part of the semiconductor substrate, the first oxide layer;

forming, above the third part of the substrate, a third oxide layer having a third thickness smaller than the second thickness;

nitriding the second oxide layer and the third oxide layer, without nitriding the first oxide layer above the first part, so as to form a first oxy-nitride layer above the second part of the semiconductor substrate and a second oxy-nitride layer above the third part of the semiconductor substrate;

forming a first gate structure over the first oxide layer for a first metal-oxide semiconductor transistor which uses the first oxide layer as a gate oxide layer;

forming a second gate structure over the first oxy-nitride layer for a second metal-oxide semiconductor transistor which uses the first oxy-nitride layer as a gate oxide layer; and forming a third gate structure over the second oxy-nitride layer for a third metal-oxide semiconductor transistor which uses the second oxy-nitride layer as a gate oxide layer.

2. The method of claim 1, wherein the first metal-oxide semiconductor transistor has a first threshold voltage, wherein the second metal-oxide semiconductor transistor has a second threshold voltage smaller than the first threshold voltage; and wherein the third metal-oxide semiconductor transistor has a third threshold voltage smaller than the second threshold voltage.

3. The method of claim 1, further comprising:

forming a high-k dielectric layer on the first oxy-nitride layer and on the second oxy-nitride layer and on the first oxide layer; and forming a gate material layer for each of the first, second and third gate structures above the high-k dielectric layer.

4. The method of claim 1, wherein forming the first oxide layer comprises depositing a high temperature oxide.

5. The method of claim 4, wherein the high temperature oxide is silicon dioxide.

6. The method of claim 1, wherein forming the second oxide layer comprises performing a rapid thermal oxidation of the surface of the second part of the substrate.

7. The method of claim 6, wherein forming the third oxide layer comprises performing a rapid thermal oxidation of the surface of the third part of the substrate, with a duration shorter than a duration of the rapid thermal oxidation of the second part of the substrate.

8. The method of claim 1, wherein nitriding the second and the third oxide layers comprises performing a decoupled plasma nitridation (DPN).

9. The method of claim 8, wherein nitriding the second and the third oxide layers further comprises performing a post-nitridation annealing (PNA).

10. The method of claim 1, wherein the first and the second oxy-nitride layers comprise silicon oxy-nitride.

11. The method of claim 1, further comprising: forming source and drain regions of either side of the gate structures.

12. A method, comprising:

forming, above a first part of a semiconductor substrate, a first oxide layer having a first thickness;

forming, above a second part of the semiconductor substrate, a second oxide layer having a second thickness smaller than the first thickness;

forming, above a third part of the semiconductor substrate, a third oxide layer having a third thickness smaller than the second thickness;

nitriding the second oxide layer and the third oxide layer, without nitriding the first oxide layer above the first part, so as to form a first oxy-nitride layer above the second part of the semiconductor substrate and a second oxy-nitride layers above the third part of the semiconductor substrate;

forming a first gate structure over the first oxide layer for a first metal-oxide semiconductor transistor which uses the first oxide layer as a gate oxide layer;

forming a second gate structure over the first oxy-nitride layer for a second metal-oxide semiconductor transistor which uses the first oxy-nitride layer as a gate oxide layer; and forming a third gate structure over the second oxy-nitride layer for a third metal-oxide semiconductor transistor which uses the second oxy-nitride layer as a gate oxide layer.

13. The method of claim 12, further comprising:

forming a high-k dielectric layer on the first oxy-nitride layer and on the second oxy-nitride layer and on the first oxide layer; and forming a gate material layer for each of the first, second and third gate structures above the high-k dielectric layer.

14. The method of claim 12, further comprising: forming source and drain regions of either side of the gate structures.

15. The method of claim 12, further comprising: forming a high-k dielectric layer under each gate structure.

* * * * *